US006482715B2

(12) United States Patent
Park et al.

(10) Patent No.: US 6,482,715 B2
(45) Date of Patent: Nov. 19, 2002

(54) METHOD OF FORMING SHALLOW TRENCH ISOLATION LAYER IN SEMICONDUCTOR DEVICE

(75) Inventors: Tai-su Park, Suwon (KR); Ho-kyu Kang, Sungnam (KR); Dong-ho Ahn, Suwon (KR); Moon-han Park, Yongin (KR)

(73) Assignee: Samsung Electronics Co., Ltd., Kyungki-do (KR)

( * ) Notice: Subject to any disclaimer, the term of this patent is extended or adjusted under 35 U.S.C. 154(b) by 0 days.

(21) Appl. No.: 09/927,340

(22) Filed: Aug. 13, 2001

(65) Prior Publication Data

US 2002/0076900 A1 Jun. 20, 2002

(30) Foreign Application Priority Data

Dec. 16, 2000 (KR) ............................................. 00-77409

(51) Int. Cl.[7] ........................... H01L 21/76; H01L 21/20
(52) U.S. Cl. ....................... 438/424; 438/435; 438/427; 438/443; 438/445; 438/492
(58) Field of Search ................................. 438/424, 435, 438/427, 437, 443, 445, 492

(56) References Cited

U.S. PATENT DOCUMENTS

| | | | | |
|---|---|---|---|---|
| 5,811,345 A | * | 9/1998 | Yu et al. ...................... | 438/424 |
| 5,930,645 A | * | 7/1999 | Lyons et al. ................. | 438/424 |
| 5,960,299 A | * | 9/1999 | Yew et al. .................... | 438/424 |
| 5,989,977 A | * | 11/1999 | Wu .............................. | 438/431 |
| 6,033,970 A | * | 3/2000 | Park ............................ | 438/435 |
| 6,037,237 A | * | 3/2000 | Park et al. ................... | 438/424 |
| 6,063,689 A | * | 5/2000 | Chen et al. .................. | 438/424 |
| 6,090,714 A | * | 7/2000 | Jang et al. ................... | 438/692 |
| 6,110,800 A | * | 8/2000 | Chou .......................... | 438/431 |
| 6,114,220 A | * | 9/2000 | Tsai ............................ | 438/435 |
| 6,255,194 B1 | * | 7/2001 | Hong .......................... | 438/435 |
| 6,277,706 B1 | * | 8/2001 | Ishikawa .................... | 438/424 |
| 6,316,331 B1 | * | 11/2001 | Tseng ......................... | 438/431 |

FOREIGN PATENT DOCUMENTS

| | | | |
|---|---|---|---|
| JP | 406069334 A | * | 3/1994 |
| JP | 406314739 A | * | 11/1994 |
| JP | 406334031 A | * | 12/1994 |

* cited by examiner

Primary Examiner—Matthew Smith
Assistant Examiner—Chuong Luu
(74) Attorney, Agent, or Firm—Lee & Sterba, P.C.

(57) ABSTRACT

A method of forming a shallow trench isolation layer in a semiconductor device is provided, wherein a first trench and a second trench are formed in an area selected from a semiconductor substrate and a sidewall oxide layer, an anti-oxidation liner, and a mask layer are formed on the semiconductor substrate including the inner surfaces of the first and second trenches, in the same order. Using photoresist lithography, the mask layer and the anti-oxidation layer are etched in the second trench. An isolation layer is formed in the first and second trenches by depositing and then chemically and mechanically polishing the dielectric material and the layers underneath until the semiconductor substrate surface is exposed. The first trench provides isolation between N-FETs, an N-FET and a P-FET, an N-FET and other circuit devices, a P-FET and other circuit devices, and other circuit devices and the second trench provides isolation between P-FETs.

24 Claims, 6 Drawing Sheets

METHOD OF FORMING SHALLOW TRENCH ISOLATION LAYER IN SEMICONDUCTOR DEVICE

BACKGROUND OF THE INVENTION

1. Field of the Invention

The present invention relates to an isolation layer in a semiconductor device. More particularly, the present invention relates to a shallow trench isolation (STI) layer in a semiconductor device.

2. Description of the Related Art

With the development of better semiconductor manufacturing techniques, significant progress has been made in increasing the speed and the degree of integration of semiconductor devices. In achieving these improvements, higher density patterns and smaller sizes have become increasingly more important and, in many cases, required. For example, wide isolation regions in semiconductor devices have these requirements of higher density patterns and smaller sizes.

Local oxidation of silicon (LOCOS) layers have been mainly used as conventional isolation layers of semiconductor devices. However, bird's beak configurations are created at the edges of the isolation layer formed by the LOCOS method and thus the area of active regions is reduced and current leakage occurs. Currently, STI layers having narrow widths and excellent isolation characteristics are widely used.

A cross-sectional view describing a formation method of a conventional STI layer in semiconductor devices is shown in FIG. 1. Referring to FIG. 1, a blocking pattern (not shown) is formed on a semiconductor substrate 10 to expose an isolation region. The semiconductor substrate 10 has a cell area, a core area and a peripheral area. The blocking pattern may consist of a stack of an oxide layer and a silicon nitride layer. The exposed semiconductor substrate 10 is etched to a predetermined depth using the blocking pattern as a mask to form trenches $t_1$ and $t_2$. The trench $t_1$ may be formed in the cell area and the trench $t_2$ may be formed in the core and peripheral areas. The process used for forming the trenches $t_1$ and $t_2$ is a plasma dry etching method.

The dry etching process for forming the trenches $t_1$ and $t_2$ may cause silicon lattice damage on the inner surfaces of the trenches $t_1$ and $t_2$. Conventionally, to reduce such silicon lattice damage, a sidewall oxide layer 12 is formed by thermally oxidizing the inner surfaces of the trenches $t_1$ and $t_2$. The sidewall oxide layer 12 is a thin layer of about 50–100 Å. Also, the formation of the sidewall oxide layer 12 removes points generated at corners PP of the trenches $t_1$ and $t_2$.

Subsequently, a silicon nitride liner 14 is formed on the surface of the sidewall oxide layer 12. As the sidewall of the trench is oxidized by an additional thermal oxidation after an isolation process, the sidewall oxide layer bulks up. The silicon nitride liner 14, as known, blocks oxidation and prevents the generation of defects on the substrate due to the bulk increase in the sidewall oxide layer.

A dielectric material, for example, a high-density plasma (HDP) dielectric layer is deposited over the resultant semiconductor substrate 10 to completely fill the trenches $t_1$ and $t_2$. Next, a chemical mechanical polishing (CMP) process is performed on the HDP dielectric layer and the blocking pattern until the surface of the semiconductor substrate 10 is exposed. Additionally, trenches $t_1$ and $t_2$ are filled with the HDP dielectric layer. This completes the formation of an STI layer 16.

However, forming the thin and uniform sidewall oxide layer 12 causes the following problems. With reference to FIGS. 2A and 2B, since hot carriers of a highly integrated semiconductor metal-oxide-semiconductor (MOS) transistor generally have high energy, they enter into a thin gate oxide layer 22 or easily penetrate through the sidewall oxide layer 12 into the STI layer 16. The hot carriers penetrating into the STI layer 16 are mainly negative charges, namely, electrons 30, which are easily trapped in the silicon nitride liner 14 of the STI layer 16 and at the interface between the silicon nitride liner 14 and the sidewall oxide layer 12. The electrons 30 are closely trapped since the sidewall oxide layer 12 is very thin as described above. In the case where there are electrons 30 at the edge of the STI layer 16, positive charges, namely, holes are induced in the semiconductor substrate 10 (on which MOS transistors are formed) at the circumference of the STI layer 16. Since the electrons 30 are trapped in the silicon nitride liner 14 and on the interface between the silicon nitride liner 14 and the sidewall oxide layer 12, the holes 32 in the semiconductor substrate 10 are gathered closely together.

As shown in FIG. 2A, since the majority carriers in an N-channel field effect transistor (N-FET) are the electrons 30, a path is not formed between n-type junction areas 26a and 26b, in which the electrons 30 function as majority carriers, even though the holes 32 are densely induced at the circumference of the STI layer 16.

Meanwhile, as is well known in the art, since the majority carriers in a P-channel field effect transistor (P-FET) are the holes 32, as shown in FIG. 2B, the holes 32, which are arranged densely at the circumference of the STI layer 16, function as a current path "I" connecting p-type junction areas 28a and 28b isolated by the STI layer 16. Consequently, due to the current path 1, although p-type junction areas 28a and 28b are isolated by the STI layer 16, leakage current, such as abnormally increased standby current, is generated between adjacent P-FETs, thereby deteriorating the characteristics of the P-FETs. Here, reference numeral 24 denotes a gate electrode of a MOSFET.

Furthermore, in the case where a P-FET (not shown) is on the interface between the STI layer 16 and an active region, a channel area of the P-FET abuts the silicon nitride liner 14 where the electrons are trapped by the thin sidewall oxide layer 12. Consequently, the electrons trapped in the silicon nitride liner 14 easily induce holes in the channel area of the P-FET in the interface. Also, the holes induced in turning on the P-FET are not easily removed and remain when turning off the P-FET. Thus, the length of the channel of the P-FET on the interface is gradually reduced thereby changing the threshold voltage and breakdown voltage. Consequently, the characteristics of the P-FET are altered.

SUMMARY OF THE INVENTION

To solve the above problems, it is a feature of an embodiment of the present invention to provide a method of forming a shallow trench isolation (STI) in a semiconductor device, which is capable of reducing leakage current between P-FETs and ensuring proper characteristics of the P-FETs.

Accordingly, to achieve this feature, there is provided a method of forming a shallow trench isolation layer in a semiconductor device. In this method, a first trench and a second trench are formed in an area selected from a semiconductor substrate. A sidewall oxide layer is formed on the inner surfaces of the first and second trenches. An anti-oxidation liner is formed on the surface of the sidewall oxide layer. A mask layer is formed on the semiconductor substrate surface including the anti-oxidation liner. A photoresist pattern is formed to expose the mask layer in the second trench. The mask layer is patterned in the form of the photoresist pattern. The photoresist pattern is then removed. The anti-oxidation liner is etched in the form of the mask layer. A dielectric material is formed to completely fill the first and second trenches. A shallow trench isolation layer is formed by chemically and mechanically polishing the dielectric material and the layers underneath until the semiconductor substrate surface is exposed. The first trench provides isolation between N-FETs, an N-FET and a P-FET, an N-FET and other circuit devices, a P-FET and other circuit devices, and is other circuit devices and the second trench provides isolation between P-FETs.

The first trench may be formed in the cell area and the second trench may be formed in the core and peripheral areas.

The sidewall oxide layer may be formed by a thermal oxidation method. The anti-oxidation liner may be formed of a silicon nitride layer or a silicon oxynitride layer and may be etched by a 150° C. phosphoric acid solution. The mask layer is a dielectric layer having a better etch selectivity ratio against a 150° C. phosphoric acid solution than the anti-oxidation liner. The mask layer may be a silicon oxide layer. The dielectric material filling the first and second trenches may be a high-density plasma (HDP) dielectric layer or a tetraethyl orthosilicate. oxide (TEOS) layer.

These and other features of the present invention will be readily apparent to those of ordinary skill in the art upon review of the detailed description that follows.

BRIEF DESCRIPTION OF THE DRAWINGS

The above features and advantages of the present invention will become more apparent by describing in detail a preferred embodiment thereof with reference to the attached drawings in which.

DETAILED DESCRIPTION OF THE PREFERRED EMBODIMENTS

Figure 1:
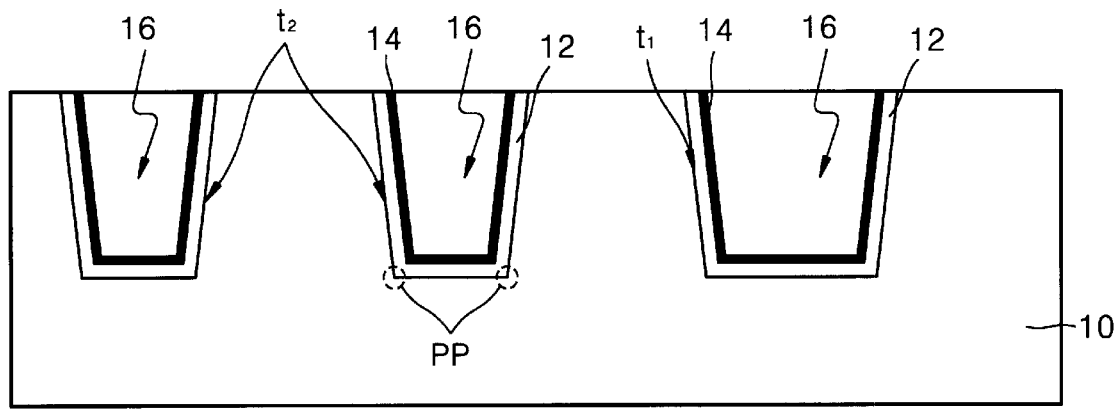
FIG. 1 illustrates a cross-sectional view describing a method of forming a conventional shallow trench isolation (STI) in a semiconductor device according to the prior art.
Figure 2A:
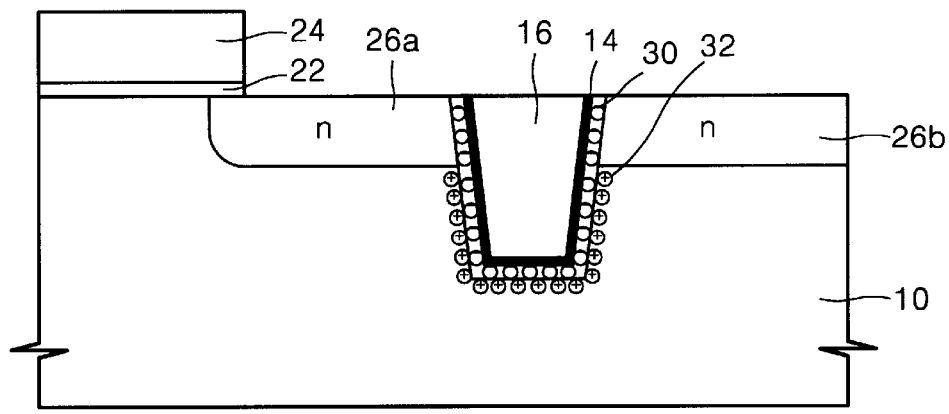
FIG. 2A illustrates a cross-sectional view of a conventional trench for defining an N-FET according to the prior art.
Figure 2B:
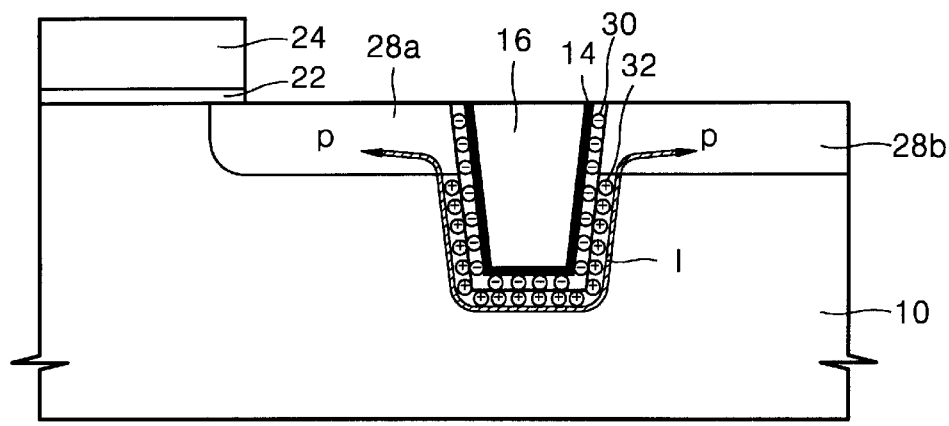
FIG. 2B illustrates a cross-sectional view of a conventional trench for defining a P-FET according to the prior art.

Korean Patent Application No. 2000-77409, filed on Dec. 16, 2000, and entitled: "Method of Forming Shallow Trench Isolation Layer in Semiconductor Device," is incorporated by reference herein in its entirety.

Hereinafter, preferred embodiments of the present invention will be described in detail with reference to the attached drawings. However, the embodiments of the present invention can be modified into various other forms, and the scope of the present invention must not be interpreted as being restricted to the embodiments. The embodiments are provided to more completely explain the present invention to those skilled in the art. In the drawings, the thicknesses of layers or regions are exaggerated for clarity. Like reference numerals in the drawings denote the same members. Also, when it is written that a layer is formed "on" another layer or a substrate, the layer can be formed directly on the other layer or the substrate, or other layers can intervene therebetween.

Figure 3A:
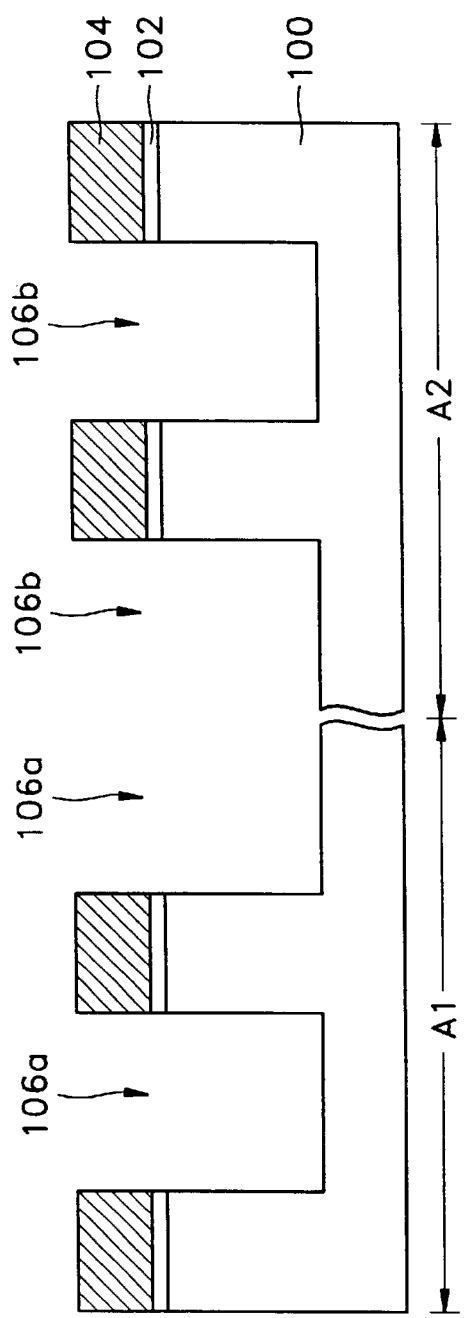
FIGS. 3A through 3G illustrate cross-sectional views describing a method of forming an STI in a semiconductor device according to an embodiment of the present invention.

First, referring to FIG. 3A, a pad oxide layer 102 and a silicon nitride layer 104 are sequentially stacked over a semiconductor substrate 100. The semiconductor substrate 100, which is a silicon substrate containing selected impurities, is divided into a cell area in which a memory device will be formed and core and peripheral areas requiring one or more PMOS transistors. Also, the pad oxide layer 102 is formed to a thickness of about 70–160 Å and the silicon nitride layer 104 is formed to a thickness of about 500–1600 Å. Next, the silicon nitride layer 104 and the pad oxide layer 102 are etched using a known photolithography process to expose a pre-isolation area of the semiconductor substrate 100 thereby forming a blocking pattern. Here, the term "pre-isolation area" refers to an area for defining the cell, core and peripheral areas and providing isolation between devices in the respective area. Afterwards, the semiconductor substrate 100 is dry etched to a depth of about 0.1–1.5 μm, preferably to a depth of 0.24–0.26 μm, using the blocking patterns, namely, the patterned silicon nitride layer 104 and pad oxide layer 102 as masks. As a result, a first trench 106a and a second trench 106b are formed. The first and second trenches, 106a and 106b, are shallow trenches for forming shallow trench isolation (STI). At this time, the dry etching process may create leakage current sources such as silicon lattice damage at the surfaces of the first and second trenches 106a and 106b. In addition, points may exist at corners of the trenches 106a and 106b. Here, reference numeral A1 is an area for forming the first trench 106a. The area for forming the first trench 106a may be a cell area in which memory devices are periodically formed. Also, the area for forming the first trench 106a may be an NMOS transistor area. More particularly, the first trench formed in the area A1 may provide isolation between N-FETs, an N-FET and a P-FET, an N-FET and other circuit devices, a P-FET and other circuit devices, and other circuit devices. An area designated by A2 is an area for forming the second trench 106b. The area for forming the second trench 106b may represent the core and peripheral areas. Also, the area A2 for forming the second trench 106b may be an area for forming one or more P-FETs. More particularly, the second trench formed in A2 may provide isolation between P-FETs.

Figure 3B:
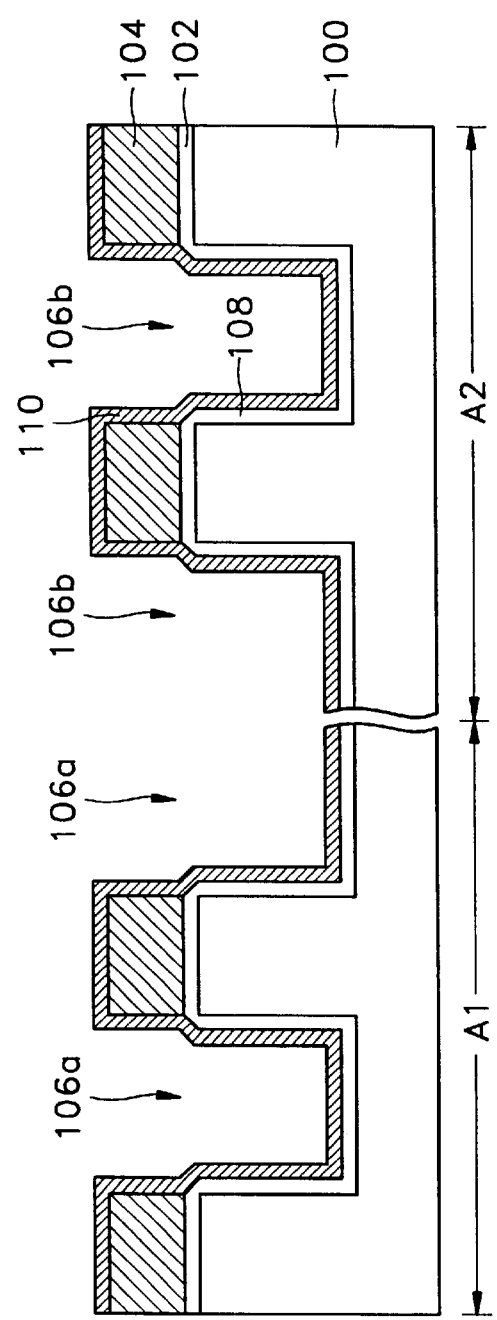

Next, as shown in FIG. 3B, a sidewall oxide layer 108 is formed in the first and second trenches 106a and 106b by thermally oxidizing the inner surfaces of the first and second trenches 106a and 106b to correct the silicon lattice defects and repair damage generated in the first and second trenches 106a and 106b and remove the points. Here, "the inner surfaces" of the trenches 106a and 106b include the inner sidewalls and bottom faces of the first and second trenches 106a and 106b. And, the sidewall oxide layer 108 is formed to a thickness of 20–240 Å, more preferably to a thickness of 20–50 Å in consideration of high integration of a semiconductor device. Afterwards, an anti-oxidation liner 110 is formed over the semiconductor substrate 100 on which the sidewall oxide layer 108 is formed. Here, the anti-oxidation liner 110 removes stress caused by an additional thermal oxidation process after the isolation process. In addition, the anti-oxidation liner 110 prevents the penetration of defects generated in an active area into the trenches 106a and 106b. A silicon nitride layer or a silicon oxynitride layer may be used as the anti-oxidation liner 110, which is formed to a thickness of 50–100 Å.

Figure 3C:
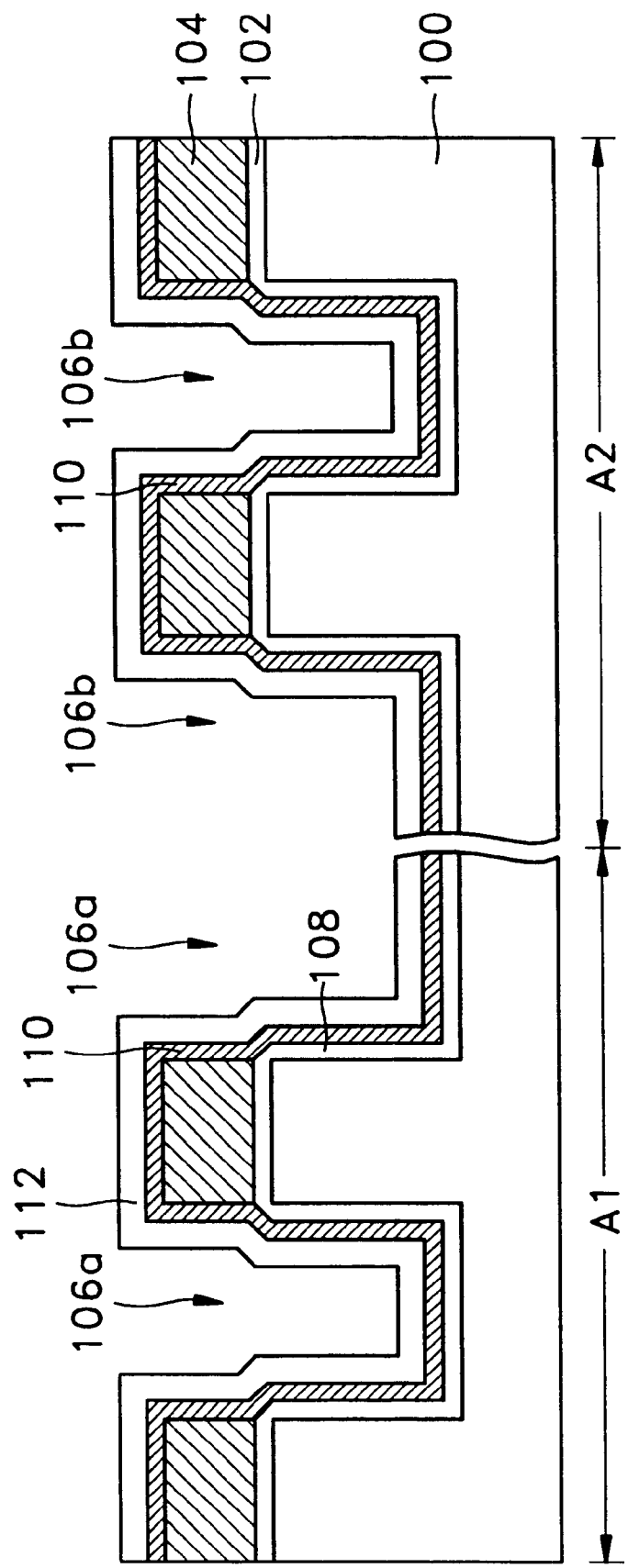

As shown in FIG. 3C, a mask layer 112 is deposited on the anti-oxidation liner 110. A dielectric material having a better etch selectivity ratio against a phosphoric acid solution than the anti-oxidation liner 110, for example, a silicon oxide layer formed by a chemical vapor deposition method, may be used as the mask layer 112. Such mask layer 112 may be formed to a thickness of 200–500 Å to serve as a mask for etching the anti-oxidation liner 110.

Figure 3D:
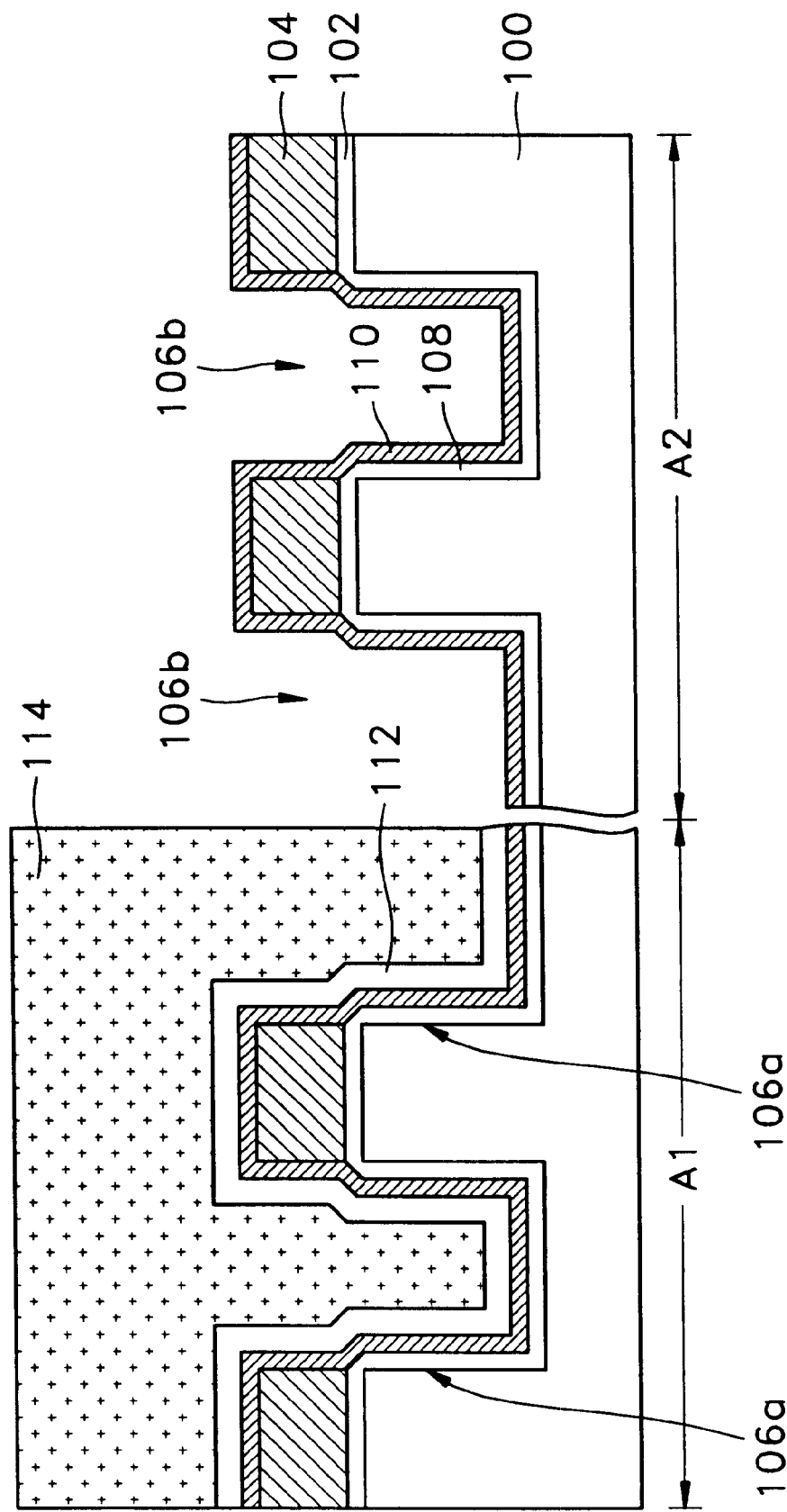

In the next step, as shown in FIG. 3D, a photoresist pattern 114 is formed by a known photolithography process to expose an area in which a trench 106b is formed in order to provide isolation between core and peripheral areas or between PMOS transistors. Next, the lower mask layer 112 is patterned using the photoresist pattern 114.

Figure 3E:
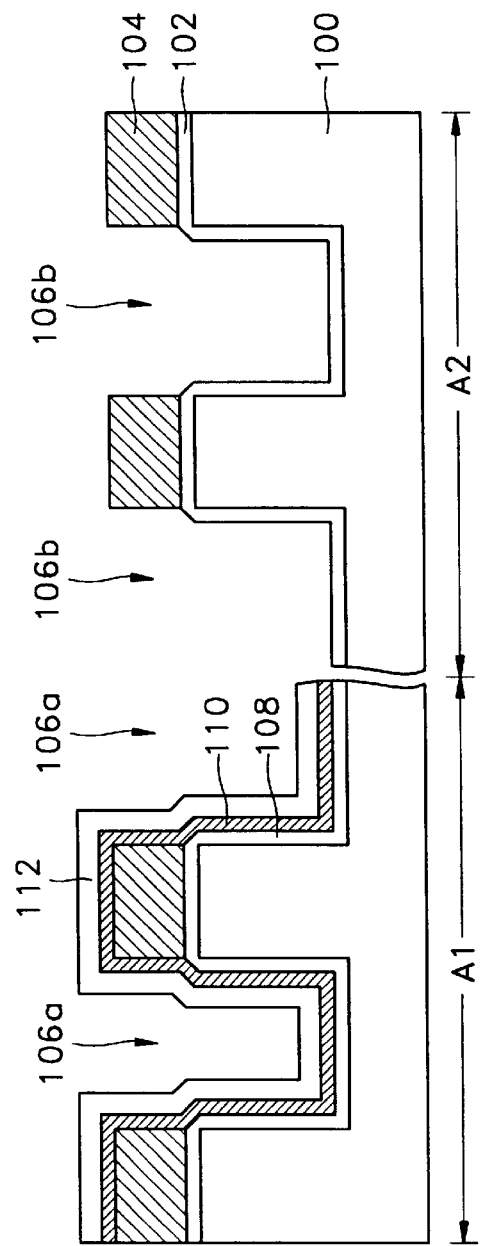

Next, as shown in FIG. 3E, the photoresist pattern 114 is removed by a known method. Then, the anti-oxidation liner 110 is etched in the form of the mask layer 112 using a phosphoric acid (PH$_3$) solution at 150° C. Here, the anti-oxidation liner 110 is etched after the mask layer 112 is additionally formed because of the following reasons. The general anti-oxidation liner 110, which is a silicon nitride layer or a silicon oxynitride layer, is dipped into a 150° C. phosphoric acid solution and then removed. At this time, the photoresist pattern 114 (See FIG. 3D) has a property of being removed by a 150° C. phosphoric acid solution. Therefore, the photoresist pattern 114 is removed when the anti-oxidation liner 110 is etched using the photoresist pattern 114 as a mask. Consequently, it is difficult to pattern the anti-oxidation liner 110 to have a desired form. As a result, in the present embodiment, a silicon oxide layer, which has a better etch selectivity ratio than the anti-oxidation liner 110, is used as an etching mask for patterning the anti-oxidation liner 110. The anti-oxidation liner 110 does not exist in the trench 106b intended for isolating core and peripheral areas or P-FETs due to the etching of the anti-oxidation liner 110 in area A2.

Figure 3F:
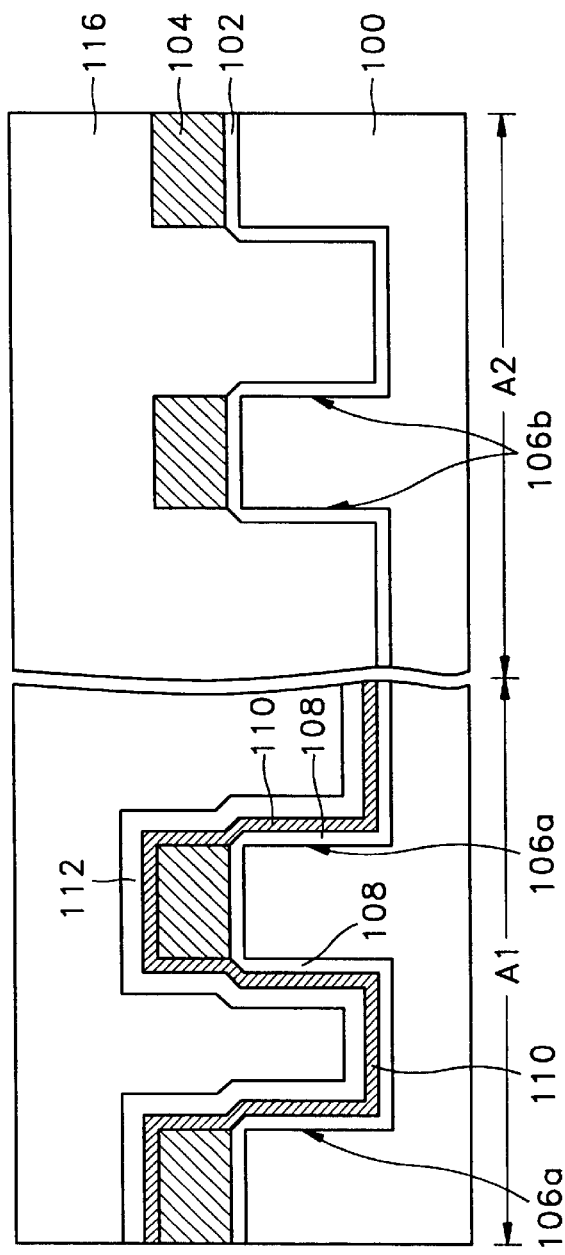

With reference to FIG. 3F, a dielectric layer 116 is deposited over the semiconductor substrate 100 to completely fill the trenches 106a and 106b. At this time, a high-density plasma (HDP) dielectric layer or a tetraethyl orthosilicate oxide (TEOS) layer having an excellent filling property may be used as the dielectric layer 116.

Figure 3G:
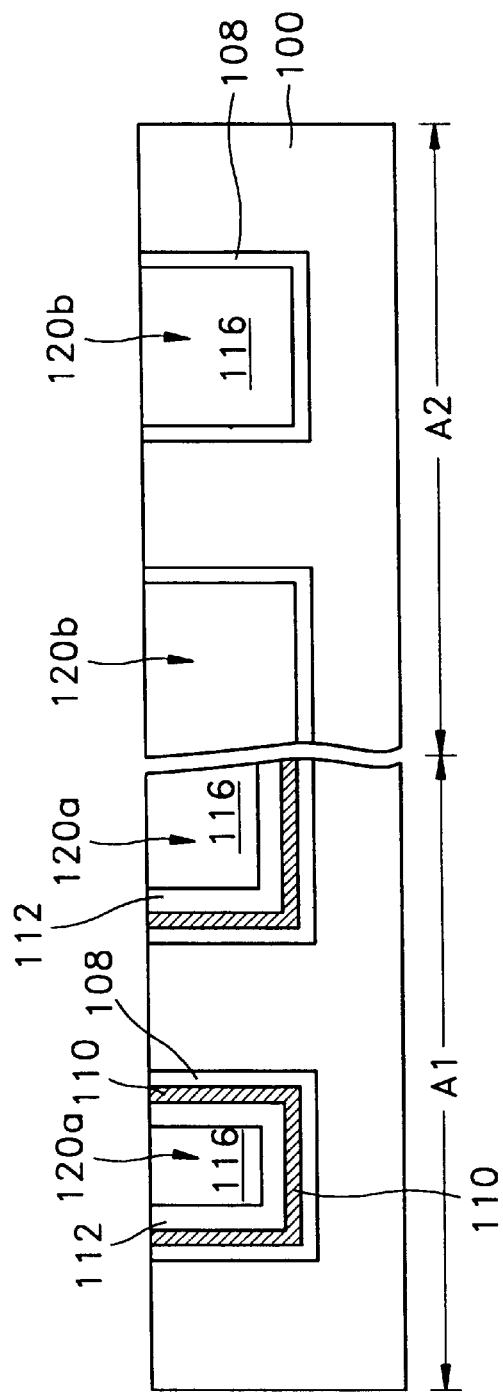

Next, as shown in FIG. 3G, a CMP process is performed on the dielectric layer 116 and the layers underneath, namely, the mask layer 112, the anti-oxidation layer 110, the silicon nitride layer 104, and the pad oxide layer 102 until the surface of the semiconductor substrate 100 is exposed. As a result, the dielectric layer 116 is filled into the respective trenches 106a and 106b, thus completing first and second STI layers 120a and 120b.

Figure 4:
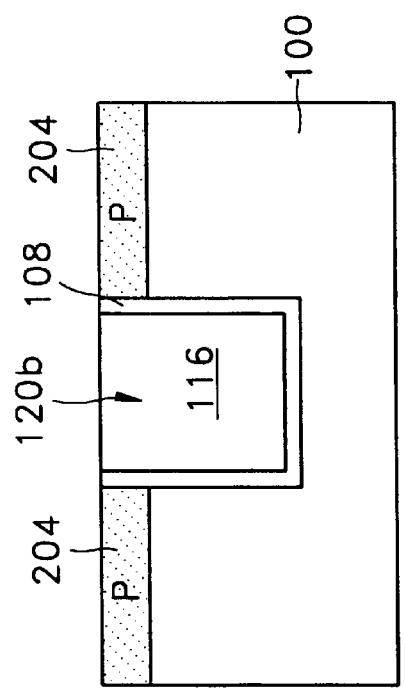
FIG. 4 illustrates a cross-sectional view of a trench for defining a P-FET according to an embodiment of the present invention.

According to the present embodiment, the anti-oxidation liner 110 of the second STI layer 120b, which is formed in the core and peripheral areas or an area for isolation between P-FETs, is selectively removed. As a result, as shown in FIG. 4, negative charges, namely, electrons are not trapped at the inner circumference of the second STI layer 120b and consequently positive charges, namely, holes are not induced at the outer face of the second STI layer 120b. As a result, a leakage current path is not generated between junction areas 204 of adjacent PMOS transistors.

At this time, the area and size of the second STI layer 120b in the core and peripheral areas (or the area for defining insulation between the P-FETs) are larger than those of the first STI layer 120a in the cell area. Consequently, stress caused by a thermal expansion coefficient difference between silicon and a silicon oxide layer is much less in the second STI layer 120b than the stress generated in the first STI layer 120a even though a subsequent thermal process is performed. Therefore, although the anti-oxidation liner 110 does not exist in the second STI layer 120b, the second STI layer 120b is not significantly affected by stress during the subsequent thermal process.

In addition, in the present embodiment, the anti-oxidation liner 110 in the core and peripheral areas is not etched using the photoresist pattern, but rather by using a separate mask layer 112 as a mask. The mask layer pattern is not lost in etching the anti-oxidation liner 110, thereby etching the anti-oxidation liner 110 to have a desired form. Further, the mask layer 112 is formed of a silicon oxide layer and there is no need to remove the mask layer 112 in the cell area after etching the anti-oxidation layer 110 in the core and peripheral areas.

As described above, according to the present invention, the anti-oxidation liner of the STI layer, which provides isolation between other circuits formed on the core and peripheral areas or between the PMOS transistors, is removed. This means the anti-oxidation liner, which has a propensity to trap negative charges, namely, the electrons in the STI layer, is removed in the trench areas intended for providing isolation between PMOS transistors. As a result, negative charges are not trapped at the inner circumference of the STI layer. Therefore, positive charges, holes, are not induced at the circumference of the STI layer. Hence, a leakage current path is not generated between the junction areas of the adjacent PMOS transistors.

Meanwhile, the anti-oxidation liner formed in the STI layer is intended for isolation in the cell area or for isolating N-FETs, in order to relieve stress. In addition, the anti-oxidation liner in the STI layer for defining the core and peripheral areas and P-FETs is selectively removed using the mask layer made of the silicon oxide layer. Consequently, the anti-oxidation liner may be removed to a desired form without any changes in its form.

Although the invention has been described with reference to a particular embodiment, it will be apparent to one of ordinary skill in the art that modifications of the described embodiment may be made without departing from the spirit and scope of the present invention.

What is claimed is:

1. A method of forming a shallow trench isolation in a semiconductor device, comprising:

forming a first trench and a second trench in an area selected from a semiconductor substrate:

forming a sidewall oxide layer on the inner surfaces of the first and second trenches;

forming an anti-oxidation liner on the surface of the sidewall oxide layer;

forming a mask layer on the semiconductor substrate surface including the anti-oxidation liner;

forming a photoresist pattern to expose the mask layer in the second trench;

patterning the mask layer in the form of the photoresist pattern;

removing the photoresist pattern;

etching the anti-oxidation liner in the form of the mask layer;

forming a dielectric material to completely fill the first and second trenches; and forming a shallow trench isolation layer by chemically and mechanically polishing the dielectric material and layers underneath until the semiconductor substrate surface is exposed.

2. The method of claim 1, wherein the first trench provides isolation between N-FETs, an N-FET and a P-FET, an N-FET and other circuit devices, a P-FET and other circuit devices, and other circuit devices; and the second trench provides isolation between P-FETs.

3. The method of claim 2, wherein the anti-oxidation liner is a silicon nitride layer or a silicon oxynitride layer.

4. The method of claim 3, wherein the anti-oxidation liner is etched by a 150° C. phosphoric acid solution.

5. The method of claim 4, wherein the mask layer is a dielectric layer having a better etch selectivity ratio against a 150° C. phosphoric acid solution than the anti-oxidation liner.

6. The method of claim 5, wherein the dielectric layer used as the mask layer is a silicon oxide layer.

7. The method of claim 1, wherein the first trench is formed in the cell area, and the second trench is formed in the core and peripheral areas.

8. The method of claim 7, wherein the anti-oxidation liner is a silicon nitride layer or a silicon oxynitride layer.

9. The method of claim 8, wherein the anti-oxidation liner is etched by a 150° C. phosphoric acid solution.

10. The method of claim 9, wherein the mask layer is a dielectric layer, having a better etch selectivity ratio against a 150° C. phosphoric acid solution than the anti-oxidation liner.

11. The method of claim 10, wherein the dielectric layer used as the mask layer is a silicon oxide layer.

12. The method of claim 1, wherein the dielectric material filling the first and second trenches is a high-density plasma dielectric layer or a tetraethyl orthosilicate oxide layer.

13. The method of claim 1, wherein the sidewall oxide layer on the inner surfaces of the first and second trenches is formed by thermal oxidation.

14. The method of claim 1, wherein the sidewall oxide layer is formed to a thickness of 20–240 Å.

15. A method of forming an STI in a semiconductor device, comprising:

forming a first trench and a second trench in an area selected from a semiconductor substrate;

forming a sidewall oxide layer on the inner surfaces of the first and second trenches;

forming an anti-oxidation liner on the surface of the sidewall oxide layer;

forming a silicon oxide layer on the semiconductor substrate surface including the anti-oxidation liner;

forming a photoresist pattern to expose the silicon oxide layer in the second trench;

patterning the silicon oxide layer in the form of the photoresist pattern;

removing the photoresist pattern;

etching the anti-oxidation liner in the form of the silicon oxide layer;

forming a dielectric material to completely fill the first and second trenches; and forming a shallow trench isolation layer by chemically and mechanically polishing the dielectric material and layers underneath until the semiconductor substrate surface is exposed.

16. The method of claim 15, wherein the first trench provides isolation between N-FETs, an N-FET and a P-FET, an N-FET and other circuit devices, a P-FET and other circuit devices, and other circuit devices; and the second trench provides isolation between P-FETs.

17. The method of claim 16, wherein the anti-oxidation liner is a silicon nitride layer or a silicon oxynitride layer.

18. The method of claim 17, wherein the anti-oxidation liner is etched by a 150° C. phosphoric acid solution.

19. The method of claim 15, wherein the first trench is formed in the cell area, and the second trench is formed in the core and peripheral areas.

20. The method of claim 19, wherein the anti-oxidation liner is a silicon nitride layer or a silicon oxynitride layer.

21. The method of claim 19, wherein the anti-oxidation liner is etched by a 150° C. phosphoric acid solution.

22. The method of claim 15, wherein the dielectric material filling the first and second trenches is a high-density plasma layer or a tetraethyl orthosilicate oxide dielectric layer.

23. The method of claim 15, wherein the sidewall oxide layer on the inner surfaces of the first and second trenches is formed by thermal oxidation.

24. The method of claim 15, wherein the sidewall oxide layer is formed to a thickness of 20–240 Å.

* * * * *